(12) United States Patent
Morikawa et al.

(10) Patent No.: US 10,099,871 B2
(45) Date of Patent: Oct. 16, 2018

(54) COMPONENT SUPPLY DEVICE

(71) Applicant: FUJI CORPORATION, Chiryu-shi (JP)

(72) Inventors: Shunji Morikawa, Toyoake (JP); Toru Matsumoto, Okazaki (JP)

(73) Assignee: FUJI CORPORATION, Chiryu-shi (JP)

( * ) Notice: Subject to any disclaimer, the term of this patent is extended or adjusted under 35 U.S.C. 154(b) by 0 days.

(21) Appl. No.: 15/516,059

(22) PCT Filed: Oct. 3, 2014

(86) PCT No.: PCT/JP2014/076504
§ 371 (c)(1),
(2) Date: Mar. 31, 2017

(87) PCT Pub. No.: WO2016/051582
PCT Pub. Date: Apr. 7, 2016

(65) Prior Publication Data
US 2017/0305693 A1  Oct. 26, 2017

(51) Int. Cl.
*B65G 47/00* (2006.01)
*B65G 47/02* (2006.01)
(Continued)

(52) U.S. Cl.
CPC ............ *B65G 65/34* (2013.01); *H05K 13/02* (2013.01)

(58) Field of Classification Search
None
See application file for complete search history.

(56) References Cited

U.S. PATENT DOCUMENTS

| 2,774,519 | A | | 12/1956 | Aldred | |
|---|---|---|---|---|---|
| 4,462,520 | A | * | 7/1984 | Strehlow | B65G 47/19 198/525 |

(Continued)

FOREIGN PATENT DOCUMENTS

| FR | 2 729 374 A1 | 7/1996 |
|---|---|---|
| JP | 4-292332 A | 10/1992 |

(Continued)

OTHER PUBLICATIONS

International Search Report dated Dec. 22, 2014, in PCT/JP2014/076504, filed Oct. 3, 2014.
(Continued)

*Primary Examiner* — Kavel Singh
(74) *Attorney, Agent, or Firm* — Oblon, McClelland, Maier & Neustadt, L.L.P.

(57) ABSTRACT

A loose component supply device provided with component supply apparatus that stores multiple components, frame to which the component supply apparatus is detachably attached, claw member for locking the component supply apparatus to the frame, and a component support member that supports multiple component in a scattered state, the components having been ejected from an entrance of the component supply apparatus that is attached to the frame; the locking of the component supply apparatus to the frame is released by an operator grasping grip of the component supply apparatus. The component supply apparatus is swung, and with the swinging linking mechanism is operated such that shutter rotates downwards. That is, with the releasing of the locking of the component supply apparatus, the entrance of the component supply apparatus is covered by the shutter.

4 Claims, 11 Drawing Sheets

(51) Int. Cl.
*B65G 65/34* (2006.01)
*H05K 13/02* (2006.01)

(56) References Cited

U.S. PATENT DOCUMENTS

| | | |
|---|---|---|
| 4,846,345 A | 7/1989 | Hamuro et al. |
| 5,143,506 A | 9/1992 | Sticht |
| 6,056,108 A | 5/2000 | Buchi et al. |
| 6,276,563 B1 | 8/2001 | Saldana et al. |

FOREIGN PATENT DOCUMENTS

| | | |
|---|---|---|
| JP | 10-297748 A | 11/1998 |
| JP | 10-335888 A | 12/1998 |
| JP | 11-180538 A | 7/1999 |
| JP | 2009-295618 A | 12/2009 |

OTHER PUBLICATIONS

Extended European Search Report dated Sep. 22, 2017 in Patent Application No. 14903097.5.

\* cited by examiner

COMPONENT SUPPLY DEVICE

TECHNICAL FIELD

The present application relates to a component supply device provided with a component support section that supports multiple components in a scattered state.

BACKGROUND ART

There is a component supply device, such as that disclosed in the patent literature below, in which a storage section that stores multiple components is attachable to and removable from an attachment section. With such a device, a shutter is arranged at the opening of the storage section, and the shutter is closed by an operator such that components remaining in the storage section do not fall when removing the storage section from the attachment section.

Patent Literature 1: JP-A-2009-295618

SUMMARY

According to the component supply device disclosed in the above patent literature, it is possible to prevent components remaining in the storage section from falling from the storage section when removing the storage section from the attachment section. However, an operator must open and close the shutter manually, which is troublesome work. Also, if the storage section is removed from the attachment section with the shutter not closed due to an operator mistake, many components may fall from the opening of the storage section. The present disclosure takes account of such problems and an object thereof is to provide a component supply device that prevents components falling from the storage section reliably and easily.

To solve the above problems, the component supply device of the present disclosure includes: a storage section configured to store multiple components; an attachment section to which the storage section is detachably attached; a locking mechanism configured to lock the storage section in a state attached to the attachment section; a component support section configured to support multiple components, which have been discharged from an opening of the storage section that is attached to the attachment section, in a scattered state; a closing member capable of movement to and from an open position in which the opening of the storage section is open such that a component can be discharged from the opening, and a closed position in which at least a portion of the opening of the storage section is covered such that falling of components from the entrance is prevented; and a moving mechanism configured to move the closing member to the closed position in accordance with release of the locking of the storage section to the attachment section by the locking mechanism.

Advantageous Effects

In the component supply device of the present disclosure, a locking mechanism for locking the storage section to the attachment section is provided, and an opening of the storage section is covered by a closing member in accordance with the release of the locking mechanism. Therefore, because the locking mechanism is released before the storage section is removed from the attachment section, the closing of the opening of the storage section is performed without fail. Further, because the opening of the storage section is covered automatically in accordance with the release of the locking mechanism, operator work is reduced. In this manner, according to the component supply device of the present disclosure, components are prevented from falling from the storage section reliably and easily.

Configuration of Component Mounter.

Figure 1:
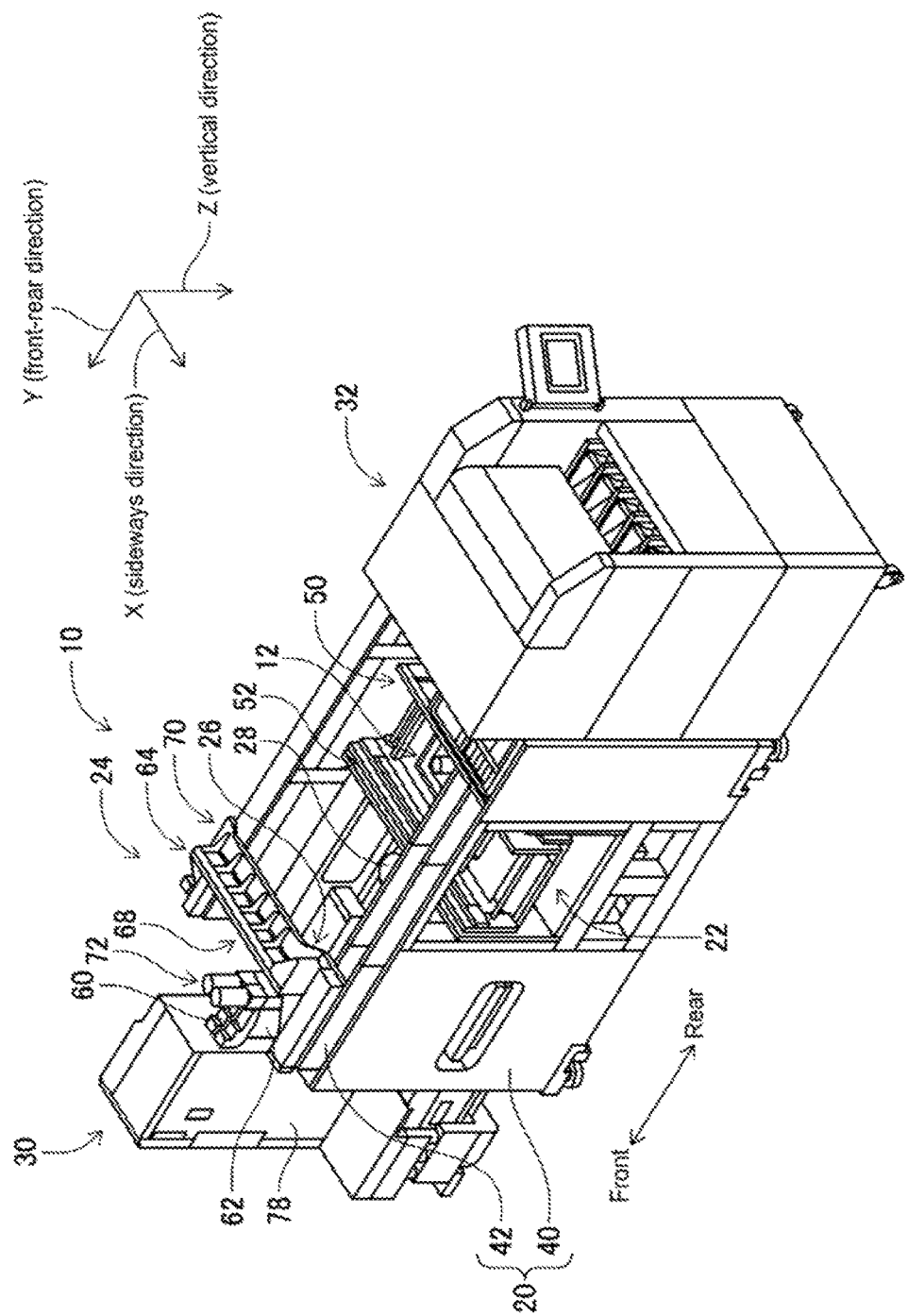
FIG. 1 is a perspective view of a component mounter.

FIG. 1 shows component mounter 10. Component mounter 10 performs work of mounting components on circuit board 12. Component mounter 10 is provided with device main body 20, board conveying and holding device 22, component mounting device 24, imaging devices 26 and 28, component supply device 30, and loose component supply device 32. Note that, examples of circuit board 12 include circuit boards and boards with a three-dimensional construction, examples of a circuit board being a printed wiring board or a printed circuit board.

Device main body 20 is configured from frame section 40 and beam section 42 that is mounted on the frame section 40. Board conveying and holding device 22 is positioned centrally inside frame section 40 in the front-rear direction, and includes conveyance device 50 and clamp device 52. Conveyance device 50 conveys circuit board 12, and clamp device 52 holds circuit board 12. Thus, board conveying and holding device 22 conveys circuit board 12 and fixedly holds circuit board 12 at a specified position. Note that, in the descriptions below, the conveyance direction of circuit board 12 is referred to as the X direction, the direction horizontally perpendicular to the X direction is referred to as the Y direction, and the vertical direction is referred to as the Z direction. That is, the width direction of component mounter 10 is the X direction, and the front-rear direction is the Y direction.

Figure 2:
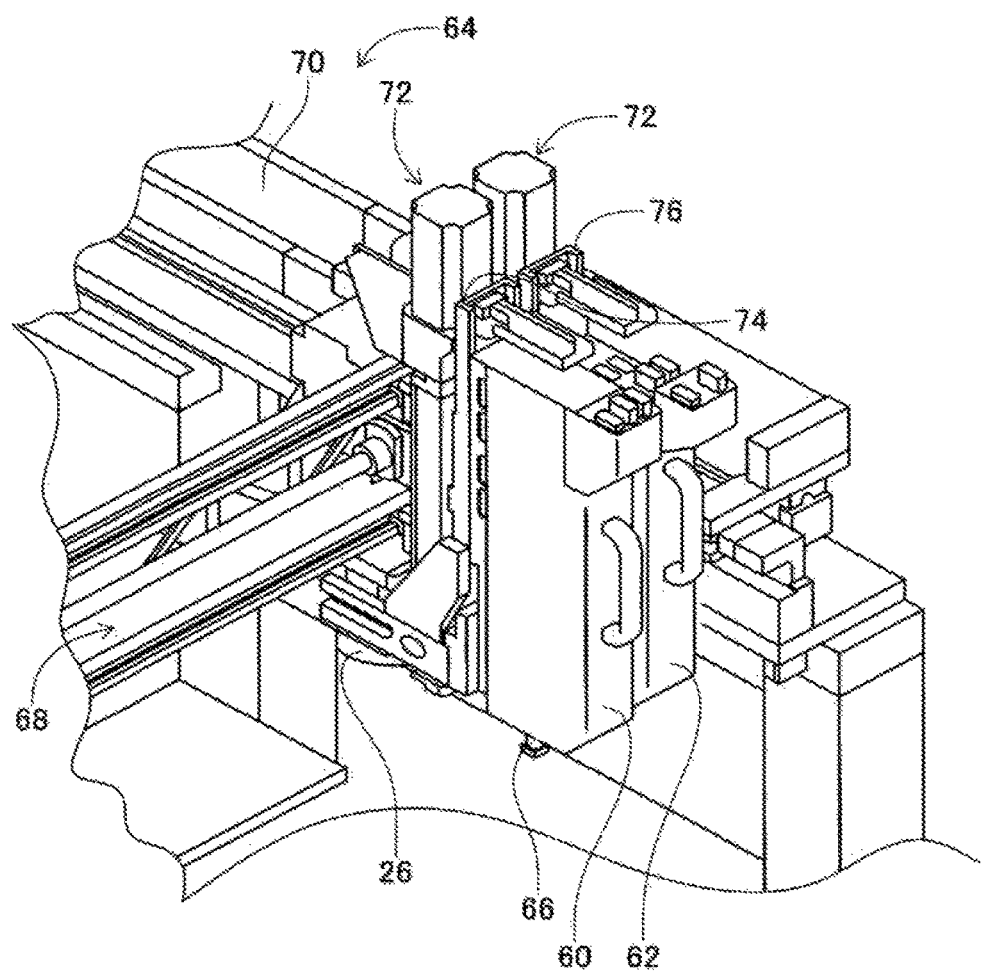
FIG. 2 is a perspective view showing a component mounting device of the component mounter.

Component mounting device 24 is provided on beam section 42, and includes work heads 60 and 62 and work head moving device 64. Each work head 60 and 62 includes holding tool (refer to FIG. 2) 66 such as a chuck or suction nozzle, and holds a component using holding tool 66. Further, work head moving device 64 includes X-direction moving device 68, Y-direction moving device 70, and Z-direction moving device 72. Work heads 60 and 62 are moved together to any position on frame 40 by X-direction moving device 68 and Y-direction moving device 70. Also, as shown in FIG. 2, work head 60 and 62 are detachably attached to sliders 74 and 76 respectively, and Z-direction moving device 72 moves sliders 74 and 76 in a vertical direction individually. That is, work heads 60 and 62 are moved in a vertical direction individually by Z-direction moving device 72.

Imaging device 26 is attached to slide 74 in a state facing downwards, and is moved in the X direction, Y direction, and Z direction together with work head 60. Thus, imaging device 26 images any position on frame section 40. As shown in FIG. 1, imaging device 28 is provided in a state facing upwards on frame section 40 between board conveying and holding device 22 and component supply device 30. Thus, imaging device 28 images a component held by component holding tool 66 of work heads 60 and 62.

Component supply device 30 is provided at an end of frame section 40 in the front-rear direction. Component supply device 30 includes tray-type component supply device 78 and feeder-type component supply device (not shown). Tray-type component supply device 78 supplies components in a state arranged in a tray. The feeder-type component supply device supplies components via a tape feeder (not shown).

Loose component supply device 32 is provided at the other end of frame section 40 in the front-rear direction. Loose component supply device 32 lines up multiple components that are in a scattered state, and supplies the components in a lined-up state. That is, this device arranges multiple components that have random orientations to have a specified orientation and supplies the components in the specified orientation. The configuration of component supply device 32 is described below in detail. Note that, components supplied by component supply device 30 and loose component supply device 32 may include electronic circuit components, configuration components of solar panels, configuration components of power modules, and the like. Also, electronic circuit components include components with leads and components without leads.

Figure 3:
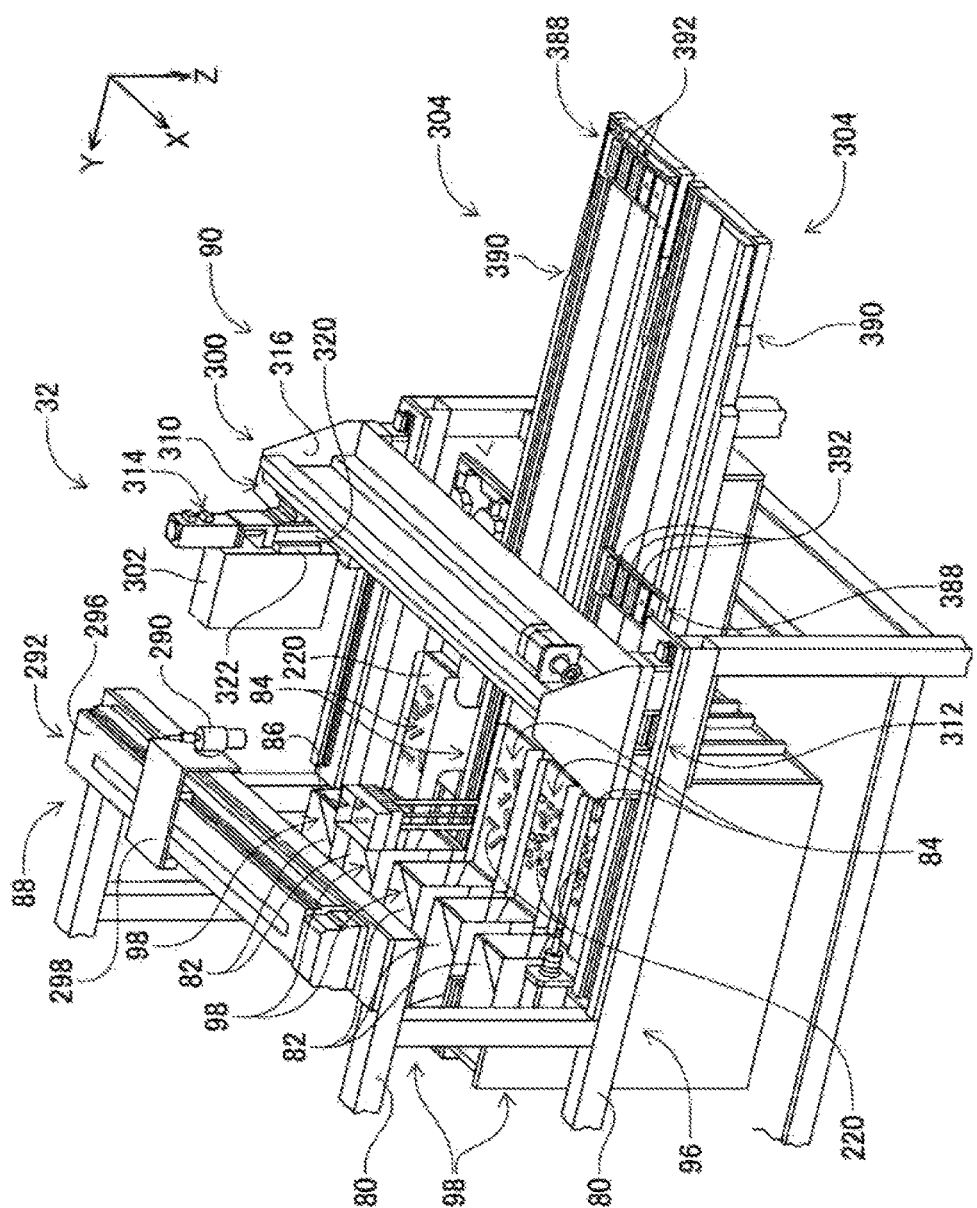
FIG. 3 is a perspective view of a loose component supply device.

As shown in FIG. 3, loose component supply device 32 includes main body 80, component supply apparatus 82, component scattering device 84, component returning device 86, imaging device 88, and component transfer device 90. Component supply apparatus 82, component scattering device 84, and component returning device 86 are assembled to frame 96 fixed to main body 80, with component supply unit 98 being configured from these component supply apparatus 82, component scattering device 84, and component returning device 86. Five component supply units 98 are arranged in loose component supply device 32, and those five component supply units 98 are arranged in one row in the X direction.

(a) Component Supply Apparatus

Figure 4:
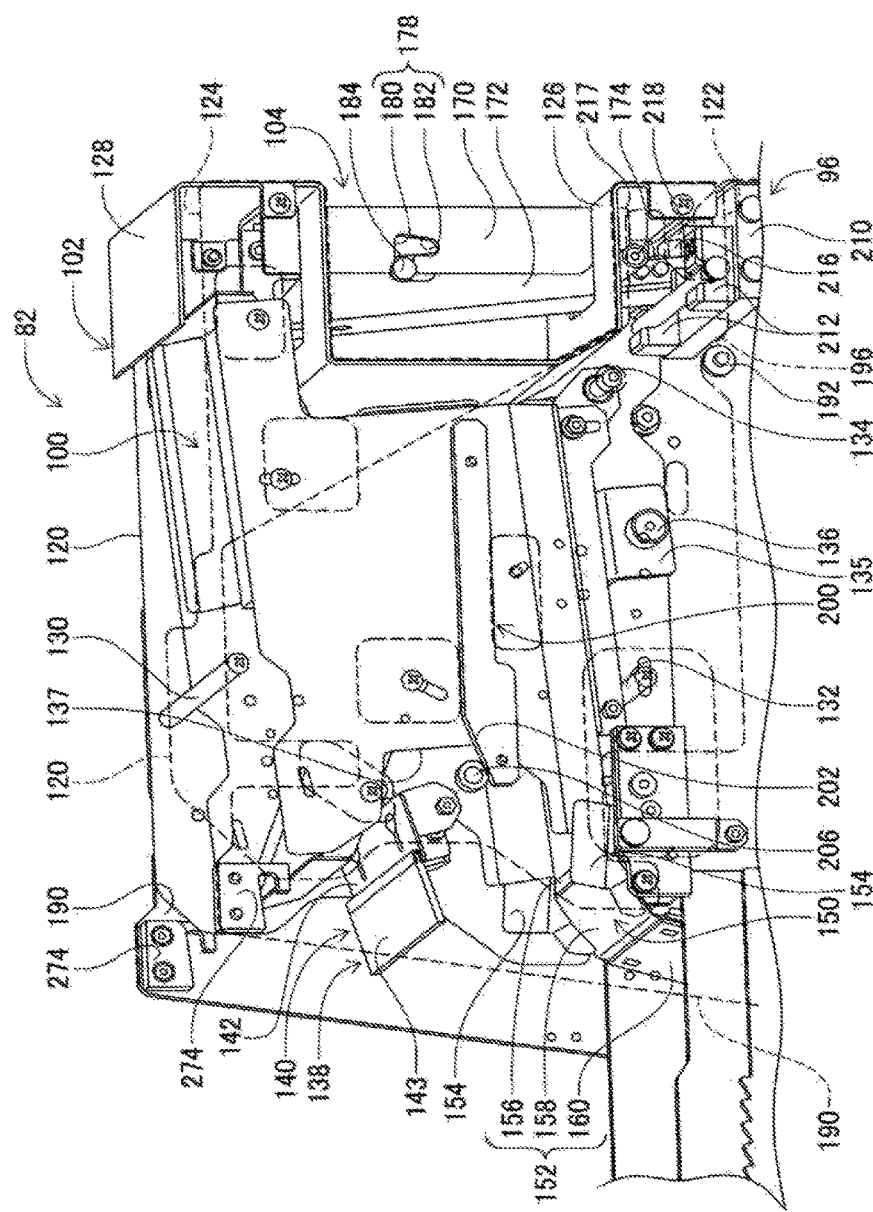
FIG. 4 is a perspective view of a component supply apparatus.
Figure 5:
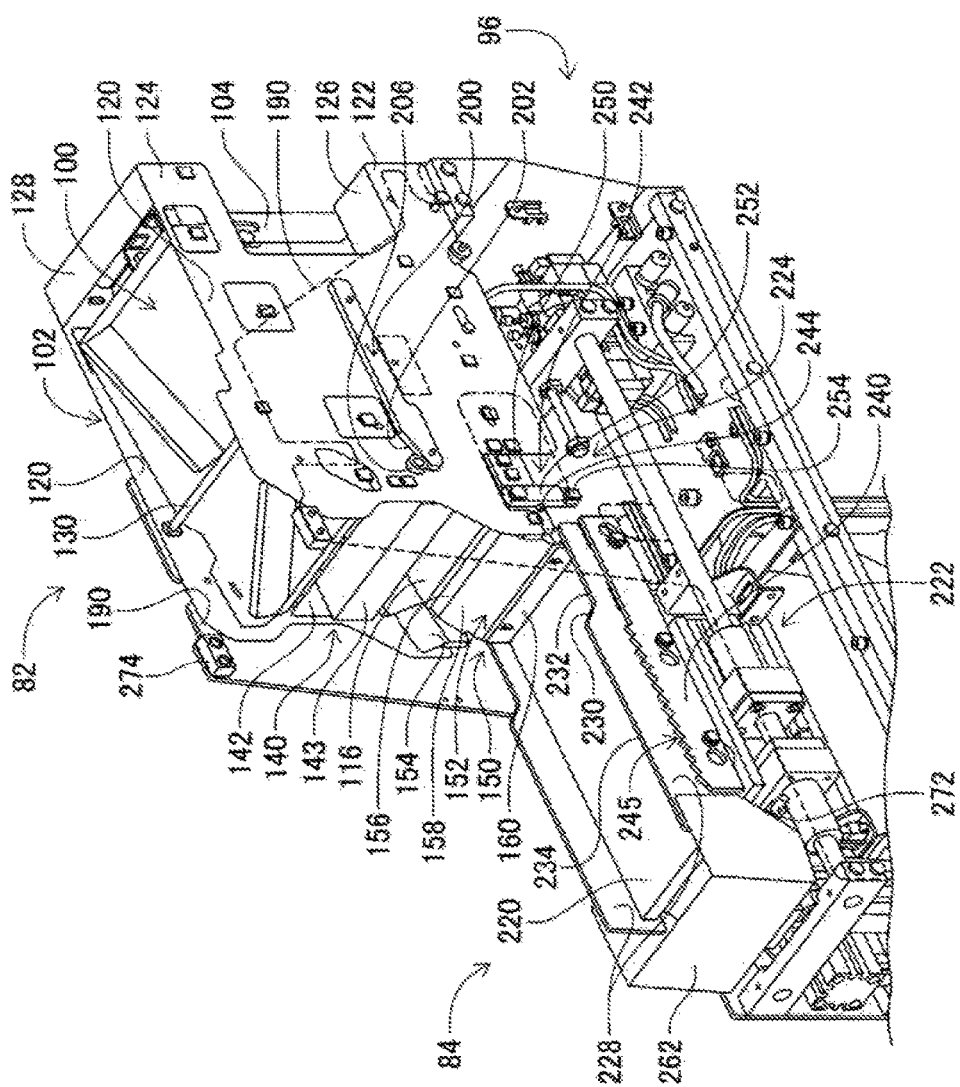
FIG. 5 is a perspective view of a component supply unit.

As shown in FIGS. 4 and 5, component supply apparatus 82 includes component storage apparatus 100, housing 102, and grip 104.

(i) Component Storage Apparatus

Figure 6:
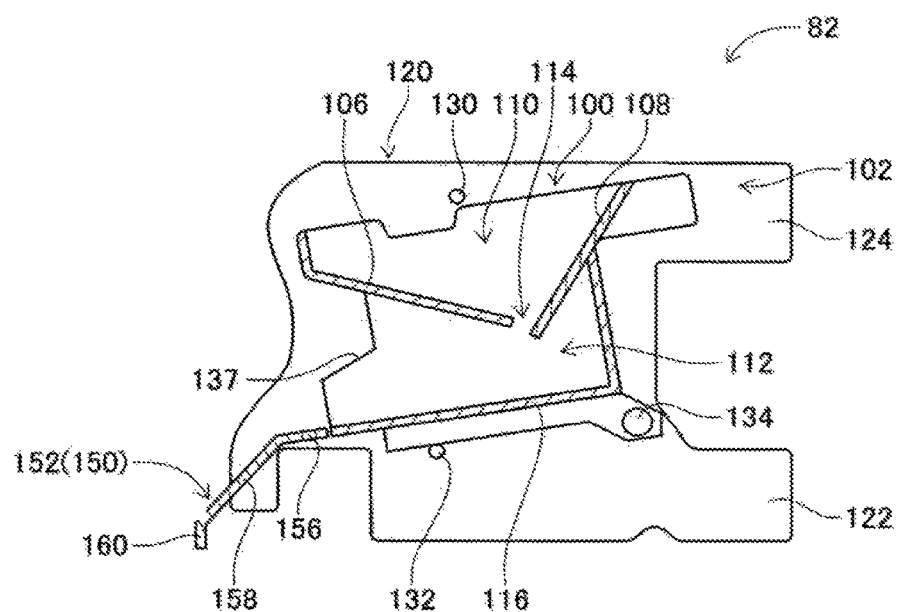
FIG. 6 is a cross-section view of a component supply apparatus.

Component storage apparatus 100 has a general shape of a rectangular parallelepiped and is open at the top surface and a side surface. As shown in FIG. 6, inside component storage apparatus 100, insertion section 110 and storage section 112 are divided by pair of inclined surfaces 106 and 108. In detail, inclined surfaces 106 and 10 are arranged such that their respective ends head towards each other, with inclined surfaces 106 and 108 being inclined such that the ends going towards each other are positioned downwards. Further, the ends of inclined surfaces 106 and 108 going towards each other are separated from each other, with entrance 114 being formed between the ends of inclined surfaces 106 and 108 that go towards each other. Note that, the inclination angle of inclined surface 106 positioned to the front of the entrance of component storage apparatus 100 is more gentle than the inclination angle of inclined surface 108. Also, entrance 114 is larger than a component stored in component storage apparatus 100.

According to such a configuration, when multiple components are inserted to insertion section 110 from the open upper surface of component storage apparatus 100, those multiple components fall on inclined surfaces 106 and 108, and fall from entrance 114 to be stored in storage section 112. Note that, the bottom surface of storage section 112, that is, the bottom surface of component storage apparatus 100, is inclined surface 116, which is inclined towards the open front surface of component storage apparatus 100.

(ii) Housing

As shown in FIGS. 4 and 5, housing 102 includes pair of side walls 120. This pair of side walls 120 have a largely rectangular shape and are arranged facing each other so as to sandwich component storage apparatus 100. Pair of protruding sections 122 and 124 that protrude in a C-shape are formed at the rear side of each side wall 120. Pair of side walls 120 are connected at protruding sections 122 and 124 via connecting members 126 and 128. Further, pair of side walls 120 are connected at an upper section by connecting rod 130, and at a lower section by connecting road 132. Note that, the distance between the pair of side walls 120 is slightly longer than the width of component storage apparatus 100 sandwiched by the pair of side walls 120.

Support shaft 134 spans the pair of side walls 120 at a base section of protruding sections 122, and component storage apparatus 100 is supported on support shaft 134 at a lower rear portion in a swingable manner. That is, component storage apparatus 100 is swingable inside housing 102 around support shaft 134. Note that, when component storage apparatus swings up, the upper end of component storage apparatus 100 contacts connecting rod 130, and when component storage apparatus swings down, the lower end of component storage apparatus 100 contacts connecting rod 132. That is, connecting rods 130 and 132 act as stoppers regulating swinging in the vertical direction of component storage apparatus 100. Further, bracket 135 is fixed to the lower end of component storage apparatus 100, and roller 136 is attached to bracket 135 to be rotatable around an axis line parallel to the width direction of component supply apparatus 82.

Cutout 137 is formed in the front side wall of component storage apparatus 100, and closing mechanism 138 is positioned in that cutout 137. Closing mechanism 138 includes shutter 140 and link mechanism (refer to FIG. 7) 141. Shutter 140 includes brush holding member 142 and brush 143. Brush holding member 142 is between the pair of side walls 120 at cutout 137, and is held at both ends to be rotatable around an axis line parallel to the width of component supply apparatus 82 via the pair of side walls 120. Brush 143 is fixed to the lower end of brush holding member 142. Brush 143 is formed as a flat brush-like member, and the dimension in the width direction of brush 143 is slightly larger than the dimension in the width direction of the inside of component storage apparatus 100.

Figure 7:
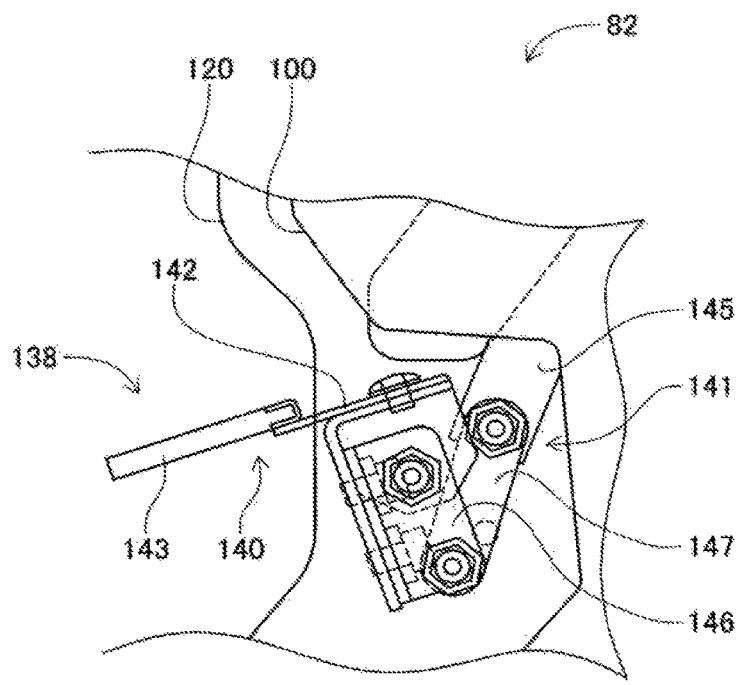
FIG. 7 is an enlarged view of a closing mechanism.

Also, as shown in FIG. 7, link mechanism 141 includes storage-apparatus-side bracket 145, holding-member-side bracket 146, and connecting link 147. Storage-apparatus-side bracket 145 is fixed to the inside of one of the cutouts 137 of the pair of side walls of component storage apparatus 100. Holding-member-side bracket 146 is fixed to brush holding member 142 so as to face storage-apparatus-side bracket 145. Also, connecting link 147 is swingably connected at each end to storage-apparatus-side bracket 145 and holding-member-side bracket 146.

Therefore, when component storage apparatus 100 is swung up, storage-apparatus-side bracket 145 and holding-member-side bracket 146 separate, and connecting link 147 moves up. Thus, brush holding member 142 is rotated clockwise, and the end of brush 143 of shutter 140 swings downwards. On the other hand, when component storage apparatus 100 is swung down, storage-apparatus-side bracket 145 and holding-member-side bracket 146 approach each other, and connecting link 147 moves downwards. Thus, brush holding member 142 is rotated counterclockwise, and the end of brush 143 of shutter 140 swings upwards.

Further, as shown in FIGS. 4 and 5, component ejection member 150 is fixedly provided between the pair of side walls 120 so as to be positioned in front of the lower front end of component storage apparatus 100. Component ejection member 150 includes inclined plate 152, and pair of side plates 154 established at each end in the width direction of inclined plate 152. Inclined plate 152 is configured from three different inclined surfaces. First inclined surface 156, which is closest to component storage apparatus 100, is inclined in the same direction as inclined surface 116 of component storage apparatus 100, and is inclined approximately the same angle as inclined surface 116. Second inclined surface 158, which is connected to first inclined surface 156, is inclined in the same direction as first inclined surface 156, and is inclined at a steeper angle than first inclined surface 156. Third inclined surface 160, which is connected to second inclined surface 158, is inclined in the same direction as second inclined surface 158, and is inclined roughly in a vertical direction.

(iii) Grip

As shown in FIG. 4, grip 104 is configured from fixed holding member 170 and movable holding member 172. Fixed holding member 170 is a rectangular tube with one open side. Fixed holding member 170 is fixed to connecting member 128 at an upper end section in a state with the open side facing between the pair of side walls 128, and is fixed at a lower end section to connecting section 126. Movable holding member 172 is also a rectangular tube with one open side. The dimension in the width direction of movable holding member 172 is slightly smaller than the dimension in the width direction of fixed holding member 170. Movable holding member 172 fits inside fixed holding member 170 such that the open side of movable holding member 172 faces the open side of fixed holding member 170.

Also, support shaft 174 spans the pair of side walls 120 at protruding sections 122, and movable holding member 172 is supported on support shaft 174 at a lower portion in a swingable manner. That is, movable holding member 172 is swingable around a lower portion thereof, such that an upper portion of movable holding member 172 approaches and separates from fixed holding member 170. An upper portion of movable holding member 172 is connected to the rear surface of component storage apparatus 100 by a connecting arm (not shown). Therefore, when movable holding member 172 swings, component storage apparatus 100 also swings. That is, when the upper portion of movable holding member 172 swings in a direction away from fixed holding member 170, component storage apparatus 100 swings downwards. Conversely, when the upper portion of movable holding member 172 swings in a direction approaching fixed holding member 170, component storage apparatus 100 swings upwards.

Also, cutout section 178 is formed in a side surface of fixed holding member 170. Cutout section 178 is formed from first cutout section 180 that is cut out in approximately a horizontal direction towards the inside from the side of fixed movable member 170 that is open, and second cutout section 182 that is cut out downwards from the end section on the internal side of first cutout 180. Engaging member 184 that engages with cutout 178 is fixed to a side surface of movable holding member 172. Also, a spring (not shown) is provided in a compressed state between fixed holding member 170 and movable holding member 172. Therefore, movable holding member 172 is biased in a direction away from fixed holding member 170 by the elastic force of the spring. Here, engaging member 184 of movable holding member 172 is engaged with first cutout section 180 of cutout section 178.

That is, usually, movable holding member 172 is biased in a direction away from fixed holding member 170, and the upper portion of movable holding member 172 swings away from fixed holding member 170. Thus, as shown in FIG. 6, component storage apparatus 100 swings downwards and contacts connecting rod 132. Here, the front side end portion of inclined surface 116 of component storage apparatus 100 faces the rear side end portion of inclined surface 156 of inclined plate 152 substantially without a gap.

Also, component supply apparatus 82 is attached to frame 96 in a removable manner. In detail, as shown in FIGS. 4 and 5, frame 96 includes a pair of side frame sections 190. This pair of side frame sections 190 are largely plate-shaped, and are arranged to face each other separated by a specified distance. The distance between the pair of side frame sections 190 is the dimension in the width direction of component supply apparatus 82, that is, slightly longer than the distance between the pair of side walls 120. Therefore, component supply apparatus 82 is inserted between the pair of side frame sections 190.

Further, engaging pin 192 that protrudes towards the inside of frame 96 is fixed to the internal wall of each side frame section 190. Conversely, cutout section 196 is formed at the lower edge of each side wall 120 of component supply apparatus 82. Also, elongated support member 200 is fixed to the internal side wall of each side frame section 190 extending in a front-rear direction. Inclined surface 202 that inclines downwards the further forward it extends is formed at the front side end section of support member 200. Conversely, engaging pin 206 is established on the outer side wall of each side wall 120 of component supply apparatus 82. Further, when component supply apparatus 82 is inserted between the pair of side frame sections 190, engaging pin 192 engages with cutout section 196, and engaging pin 206 is supported by inclined surface 202 of support member 200. Accordingly, the position of component supply apparatus 82 is decided between the pair of side frame sections 190.

Also, as shown in FIG. 4, frame main body section 210 is provided below connecting member 126 of component supply apparatus positioned between the pair of side frame sections 190. The pair of support blocks 212 are fixed on the upper surface of frame main body section 210 lined up in the width direction of frame 96. Also, an engaging rod (not shown) spans the pair of support blocks 212. And, claw member 216 is fixed to the lower end of movable holding member 172 of grip 104 of component supply apparatus 82.

Claw member 216 is roughly L-shaped, and the curved tip section thereof extends towards the engaging rod. Further, movable holding member 172 is biased in a direction away from fixed holding member 170 by the elastic force of the spring, that is, usually, the tip section of claw member 216 engages with the engaging rod. Accordingly, component supply apparatus 82 is locked in frame 96 in a state positioned between the pair of side frame sections 190.

Also, in a case in which an operator has gripped grip 104 of component supply apparatus 82, movable holding member 172 approaches fixed holding member 170 against the elastic force of the spring. Here, claw 216 fixed to the lower end of movable support member 172 is swung in a direction away from the engaging rod. Accordingly, the engagement of claw member 216 with the engaging rod is released. Therefore, by an operator raising component supply apparatus 82 in a state gripping grip 104 of component supply apparatus 82, component supply apparatus 82 is removed from frame 96.

Also, RFID (radio frequency identifier) 217 is provided on the inside of the lower end section of fixed holding member 170 of grip 104. RFID 217 sends ID information via short distance wireless communication using radio waves, and sends, as ID information, information related to components supplied by component supply apparatus 82. Conversely, receiver 218 capable of receiving ID information sent from RFID 217 is provided on the upper surface of frame main body section 210. Accordingly, with loose components 32, in a case which component supply apparatus 82 is attached to frame 96, ID information is received by receiver 218 and components supplied by component supply apparatus 82 are referenced based on the ID information.

(b) Component Scattering Device

As shown in FIG. 5, component scattering device 84 includes component support member 220, component support member moving device 222, and supply apparatus oscillating device 224. Component support member 220 is a roughly rectangular plate, and is provided to extend forwards from below inclined plate 152 of component supply apparatus 82. Side wall sections 228 are formed at each edge in the lengthwise direction of component support member 220. Stepped section 230 is formed on the upper edge of side wall section 228, and the upper edge of side wall section 228 is formed from roughly horizontal first edge section 232 positioned on the component supply apparatus 82 side of stepped section 230, and roughly horizontal second edge section 234 positioned on the opposite section of component supply apparatus 82 of stepped section 230 at a position higher than first edge section 232.

Component support member moving device 222 is for moving component support member 220 forwards and backwards by the driving of an electromagnetic motor (not shown). By this, component support member 220 moves forwards and backwards slightly below the lower end of inclined plate 152 of component supply apparatus 82 in a state with the upper surface of component support section 226 horizontal. Note that, component support member 220 moves to and from a component supply position at which roughly the entire body of component support section 226 is exposed, and a retract position at which the entire body of component support section 226 is below component supply apparatus 82.

Supply apparatus oscillating device 224 includes cam member 240, cam follower 242, and stopper 244. Cam member 240 is roughly a plate and is fixed to an outer side surface of side wall section 228 extending in a front-rear direction. Multiple teeth 245 are formed at regular intervals in the front-rear direction on the upper end section of cam member 240. Cam follower 242 includes lever 252 and 254. Lever 252 is provided on the lower end section of side wall 120 of component supply apparatus 82 so as to extend in a vertical direction, and is supported by side wall 120 at the upper end section so as to be swingable around an axis line parallel to the width direction of component supply apparatus 82. Roller 254 is held by the bottom end of lever 252 to be rotatable around an axis line parallel to the width direction of component supply apparatus 82. Note that, lever 252 is biased in a direction facing forwards by the elastic force of a coil spring (not shown).

Stopper 244 is provided protruding from side wall 120, and lever 252 biased by the elastic force of the coil spring contacts stopper 244. Note that, lever 252 extends downwards in a vertical direction in a state contacting stopper 244.

(c) Component Returning Device

Figure 8:
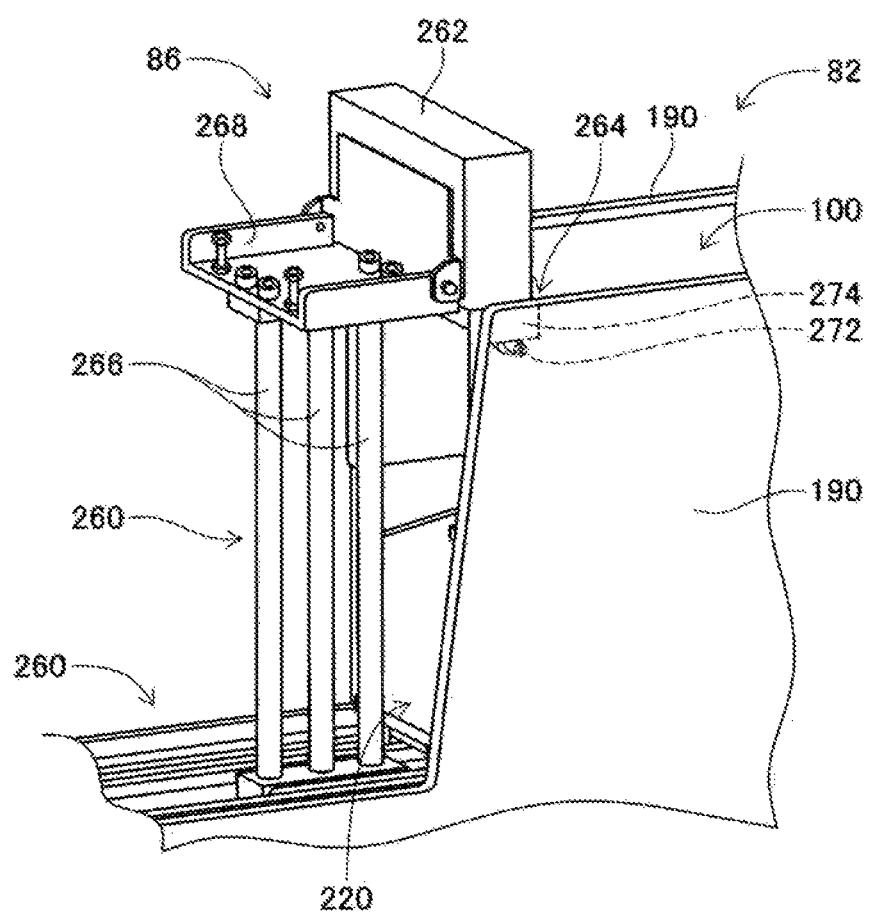
FIG. 8 is a perspective view showing the component supply unit in a state with a component collection container raised to an upper limit position.

As shown in FIG. 8, component returning device 86 includes container raising and lowering device 260, and component collection container 262. Container raising and lowering device 260 includes air cylinder 266 and raising and lowering member 268, and raising and lowering member 268 is raised and lowered by operation of air cylinder 266. Also, air cylinder 266 is fixed to the front side end of component support member 220. Accordingly, air cylinder 266 moves forwards and backwards together with component support member 220 by operation of component support member moving device 222.

Component collection container 262 is provided on the upper surface of raising and lowering member 268 and is moved up and down by operation of air cylinder 266. Here, component collection container 262 is moved to and from a raised position that is higher than component supply apparatus 82, and a lowered position that is below component support member 220.

Component collection container 262 is a box that is open at the top, and is supported on the top surface of raising and lowering member 268 to be rotatable around an axis line parallel to the width direction of component supply apparatus 82. Accordingly, component collection container 262 rotates to and from a component receiving state (the state of component collection container 262 in FIG. 12) in which the bottom surface is horizontal and it is possible to receive components from the entrance, and a component ejection state (the state of component collection container in FIG. 8) in which the bottom surface is vertical and components can be ejected from the entrance. Note that, component collection container 262 is biased in the direction of the component receiving state by a coil spring (not shown).

As shown in FIG. 5, protruding pin 272 is provided on the rear side end section of component collection container 262. Protruding pin 272 protrudes towards the outside on the side of component collection container 262. Further, engaging block 274 is fixed to the inside of the front side top end section of side frame section 190. Also, as shown in FIG. 8, when component collection container 262 is raised to the raised position by operation of air cylinder 266, protruding pin 272 engages with engaging block 274. By this, component collection container 262 rotates and enters the component ejection state.

(d) Imaging Device

As shown in FIG. 3, imaging device 88 includes camera 290 and camera moving device 292. Camera moving 292 includes guide rail 296 and slider 298. Guide rail 296 is fixed to main body 80 above component supply apparatus 82 so as to extend in the width direction of loose component supply device 32. Slider 298 is slidably attached to guide rail 296, and can be slid to any position by operation of an electromagnetic motor (not shown). Also, camera 290 is attached to slider 298 facing downwards.

(e) Component Transfer Device

As shown in FIG. 3, component transfer device 90 includes component holding head moving device 300, component holding head 302, and two shuttle devices 304.

Component holding head moving device 300 includes X-direction moving device 310, Y-direction moving device 312, and Z-direction moving device 314. Y-direction moving device 312 includes Y slider 316 provided above component supply unit 98 extending in the X direction, and Y slider 316 is moved to any position in the Y direction by operation of an electromagnetic motor (not shown). X-direction moving device 310 includes X slider 320 provided on a side surface of Y slider 316, and X slider 320 is moved to any position in the X direction by operation of an electromagnetic motor (not shown). Z-direction moving device 314 includes Z slider 322 provided on a side surface of X slider 320, and Z slider 322 is moved to any position in the Z direction by operation of an electromagnetic motor (not shown).

Figure 9:
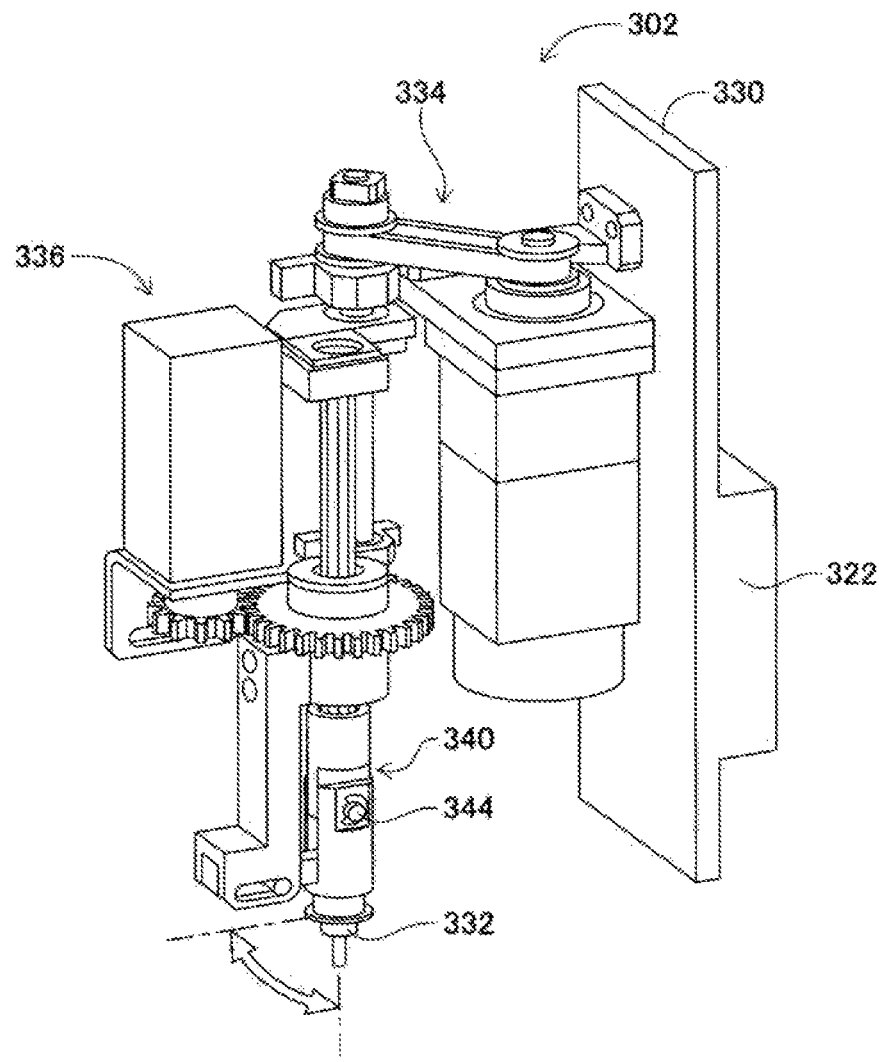
FIG. 9 is a perspective view of a component holding head.

As shown in FIG. 9, component holding head 302 includes head main body 330, suction nozzle 332, nozzle pivoting device 334, and nozzle rotating device 336. Head main body 330 is formed as one body with Z slider 322. Suction nozzle 332 picks up and holds a component using negative pressure and is attached to the lower end of nozzle holder 340. Nozzle holder 340 is able to bend at support shaft 344, and nozzle holder 340 bends 90 degrees by operation of nozzle pivoting device 334. By this, suction nozzle 332 attached to the bottom end of nozzle holder 340 is pivoted 90 degrees to be positioned at the pivoted position. That is, suction nozzle 332 is able to be pivoted to and from a non-pivoted position and a pivoted position by operation of nozzle pivoting device 334. Further, nozzle rotating device 336 rotates suction nozzle 332 around its own center axis.

As shown in FIG. 3, each of the two shuttle devices 304 includes component carrier 388, and component carrier moving device 390, and is fixed to main body 80 lined up in the sideways direction on the front side of component supply unit 98. Five component receiving members 392 are attached to component carrier 388 lined up in a single row sideways, and components are loaded on each component receiving member 392.

Figure 10:
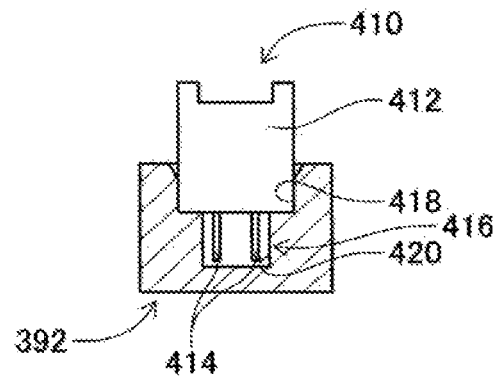
FIG. 10 is a cross-section view of a component receiving member of a component carrier.

In detail, as shown in FIG. 10, components supplied by loose component supply device 32 are electronic circuit components 410 that have leads (hereinafter also referred to as "leaded components"), being configured from a block-like component main body 412, and two leads 414 that protrude from the bottom surface of component main body 412. Also, component reception recess 416 is formed in component receiving member 392. Component reception recess 416 is a stepped recess configured from main body section reception recess 418 open at the top surface of component receiving member 392, and lead reception recess 420 open in the bottom surface of main body section reception recess 418. Leaded component 410 is inserted inside component reception recess 416 with leads 414 pointing downwards. Therefore, leaded component 410 is loaded inside component reception recess 416 with leads 414 inserted into lead reception recess 420 and component main body 412 inserted into main body section reception recess 418.

As shown in FIG. 3, component carrier moving device 390 is a long plate member provided on the front side of component supply unit 98 extending in the front-rear direction. Component carrier 388 is provided on the upper surface of component carrier moving device 390 to be slidable in the front-rear direction, and is slid to any position in the front-rear direction by operation of an electromagnetic motor (not shown). Note that, component carrier 388, when slid in a direction approaching component supply unit 98, is slid to a component receiving position that is positioned within the movement range of component holding head 302 by component holding head moving device 300. Conversely, when slid in a direction away from component supply unit 98, component carrier 388 is slid to a component supply position that is positioned within the movement range of work heads 60 and 62 by work head moving device 64.

Component Mounter Operation

Component mounter 10, according to the above configuration, mounts components on circuit board 12 held by board conveying and holding device 22. Specifically, circuit board 12 is conveyed to a work position, and is fixedly held at that position by clamp device 52. Next, imaging device 26 moves above circuit board 12 and images circuit board 12. By this, information related to a holding position error of circuit board 12 is obtained. Also, component supply device 30 or loose component supply device 32 supplies components at a specified supply position. Component supply by loose component supply device 32 is described in detail later. One of the work heads 60 or 62 moves above the component supply position and holds a component using component holding tool 66. Then, work head 60 or 62 holding the component moves above imaging device 28, and the component being held by component holding tool 66 is imaged by imaging device 28. Accordingly, information related to an error of the holding position of the component is obtained. Next, work head 60 or 62 holding the component moves above circuit board 12, and mounts the held component on circuit board 12 after correcting for the error in the holding position of circuit board 12 and the error in the holding position of the component and so on.

Loose Component Supply Device Operation (a) Supply of Leaded Components Using Loose Component Supply Device With loose component supply device 32, leaded components 410 are inserted by an operator into component storage apparatus 100 of component supply apparatus 82, then, the inserted leaded components 410 are supplied in a state loaded on component receiving member 392 of component carrier 388 by operation of component transfer device 90. In detail, the operator inserts multiple of the same type of leaded components 410 via the entrance in the top surface of component storage apparatus 100 of component supply apparatus 82 of a component supply unit 98, which may be any one of the five component supply units 98. Here, component support member 220 is moved to the retract position below component supply apparatus 82 by operation of component support member moving device 222, and component collection container 262 is positioned above component supply apparatus 82.

As shown in FIG. 6, leaded components 410 inserted via the entrance on the top surface of component storage apparatus 100 fall from insertion section 110 of component storage apparatus 100 into storage section 112 via entrance 114. Here, fallen leaded components 410 roll on inclined surface 116 and spread out on inclined surface 116. Note that, in a case in which leaded components 410 that have fallen onto inclined surface 116 roll and fall beyond inclined plate 152, they are collected in component collection container 262 positioned in front of component supply apparatus 82.

Figure 11:
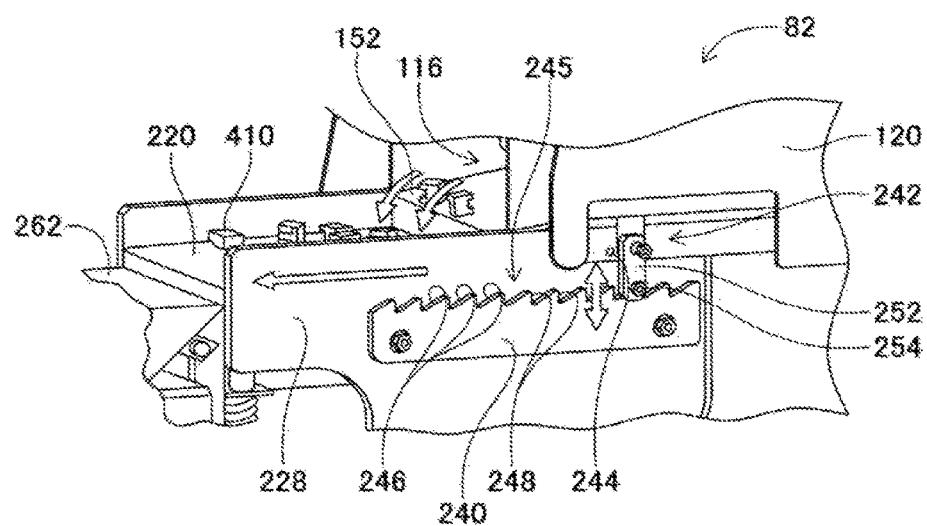
FIG. 11 is a perspective view of a component scattering device.

After leaded components 410 have been inserted into component storage apparatus 100, component support member 220 is moved forwards from below component supply apparatus 82 by operation of component support member moving device 222. Here, as shown in FIG. 11, as cam member 240 engages with cam follower 242, roller 254 of cam follower 242 rides over teeth 245 of cam member 240. Lever 252 of cam follower 242 is biased in a direction facing forwards by the elastic force of a coil spring, with the biasing forward of lever 252 being regulated by stopper 244. Therefore, when component support member 220 is moved forwards, roller 254 and teeth 245 are maintained in an engaged state, and roller 254 rides over teeth 245 without lever 252 being rotated forwards. Here, component supply apparatus 82 is raised by the riding over of teeth 245 by roller 254. That is, with roller 254 engaged with teeth 245, component support member 220 is moved forward, such that roller 254 rides over multiple teeth 245 and component supply apparatus is oscillated by being consecutively moved up and down.

Leaded components 410 spread out on inclined surface 116 of component supply apparatus 100 are moved forwards by the oscillation of component supply apparatus 82 and the incline of inclined surface 116, and are ejected onto the upper surface of component support member 220 via inclined surface 152. Here, leaded components 410 are prevented from falling from component support member 220 by side wall sections 228 of component support member 220. And, by component support member 220 being moved to the component supply position, multiple leaded components 410 are scattered on the upper surface of component support member 220.

When component support member 220 reaches the component supply position, camera 290 of imaging device 88 is moved above component support member 220, on which leaded components 410 are scattered, by operation of camera moving device 292, and images leaded components 410. Then, based on the image data, component holding head 302 is moved above leaded component 410 that is a target for pickup by operation of component holding head moving device 300, and the leaded component 410 is picked up and held by suction nozzle 332. Note that, when leaded component 410 is picked up and held by suction nozzle 332, suction nozzle 332 is in the non-pivoted position.

After leaded component 410 has been picked up by suction nozzle 332, component holding head 302 is moved above component carrier 388, and here, component carrier 388 is moved to the component receiving position by operation of component carrier moving device 390. Also, when component holding head 302 is moved above component carrier 388, suction nozzle 332 is pivoted to the pivoted position. Note that, suction nozzle 332 is rotated by operation of nozzle rotating device 336 such that leads 414 of the leaded component 410 held by suction nozzle 332 that is in the pivoted position face downwards in a vertical direction.

When component holding head 302 is moved above component carrier 388, leaded component 410 in a state with leads 414 facing downwards in the vertical direction is inserted into component reception member 392. By this, leaded component 410 is loaded in component receiving member 392 with leads 414 facing vertically downwards. Then, component carrier 388 is moved to the component supply position by operation of component carrier moving device 390. With loose component supply device 32, because component carrier 388 moved to the component supply position is within the movement range of work heads 60 and 62, leaded components 410 are supplied at this position. In the manner, with loose component supply device 32, leaded components 410 are supplied with leads 414 pointing downwards, and with the surface opposite the surface to which the leads are connected facing upwards. Therefore, component holding tool 66 of work head 60 or 62 is able to appropriately hold leaded component 410.

(b) Collection of Leaded Components in Component Storage Apparatus

Figure 12:
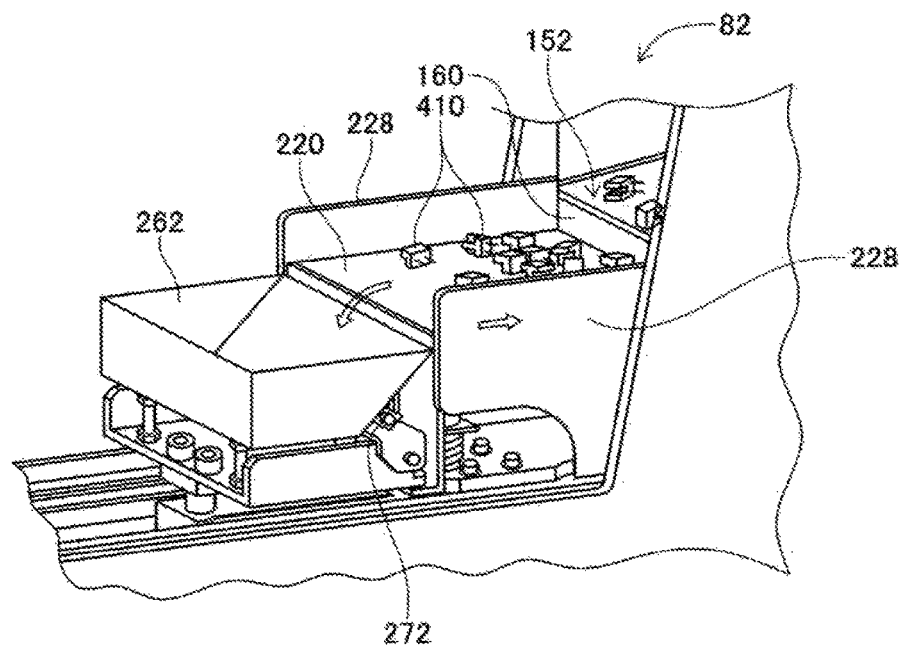
FIG. 12 is a perspective view of a component scattering device and a component returning device.

Further, with loose component supply device 32, leaded components 410 scattered on component support member 220 can be collected by component storage apparatus 100. In detail, first, component support member 220 is moved below component supply apparatus 82 by operation of component support member moving device 222. Here, as shown in FIG. 12, leaded components 410 on component support member 220 are stopped by a third inclined surface 160 of inclined plate 152 of component supply apparatus 82. By this, leaded components 410 on component support member 220 are scraped into component collection container 262. Note that, when component support member 220 is moved under component supply apparatus 82, cam follower 242 contacts cam member 240, but because lever 252 does not rotate, component supply apparatus 82 does not oscillate. Therefore, leaded components 410 inside component storage apparatus 100 are not ejected onto component support member 220.

Figure 13:
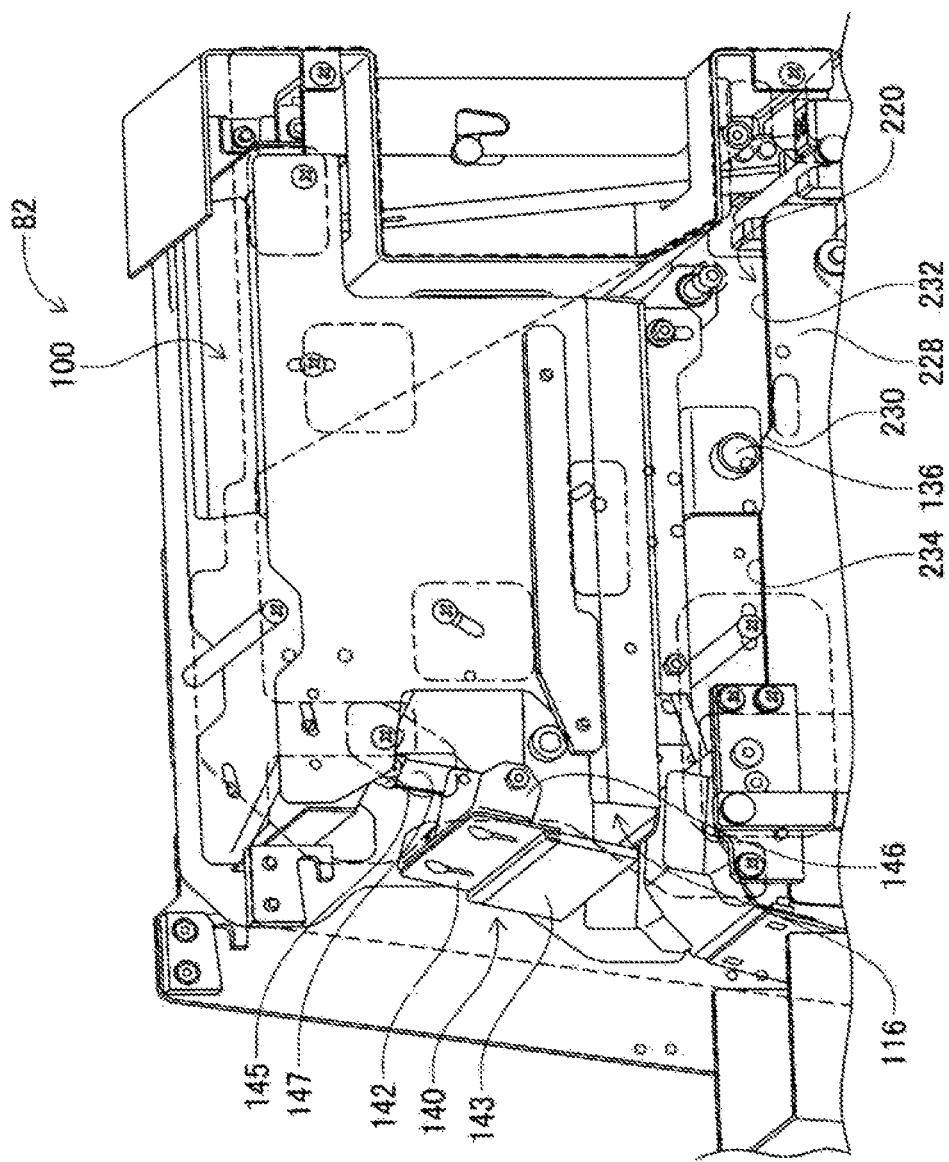
FIG. 13 is a perspective view of a component supply apparatus.

Also, when component support member 220 is moved above component supply apparatus 82, roller 136 provided on the lower end section of component storage apparatus 100 contacts the lower edge of side wall section 228 of component support member 220. Component storage apparatus 100 does not swing while roller 136 is contacting first edge section 232 of the upper edge of side wall section 228. However, when component support member 220 is moved down towards component supply apparatus 82 by a specified distance, as shown in FIG. 13, roller 136 contacts stepped section 230 of the upper edge of side wall section 228, and roller 136 rides over second edge section 234. When roller 136 rides over second edge section 234, component storage apparatus 100 is swung upwards. Here, storage apparatus side bracket 145 fixed to component storage apparatus 100 also moves up, and connecting link 147 connected to storage apparatus side bracket 145 moves up as well. Further, support member side bracket 146 connected to connecting link 147 also moves up, and the end section of the brush 143 side of shutter 140 moves downwards. By this, the front of inclined surface 116 of component storage apparatus 100 is covered by shutter 140, and leaded components 410 are prevented from being ejected from component storage apparatus 100. Also, in a case in which a leaded component 410 is sandwiched between brush 143 and inclined surface 116, damage to leaded component 410 is prevented by the elastic deformation of brush 143.

When component support member 220 is moved below component storage apparatus 82, component collection container 262 moves up by operation of container raising and lowering device 260. Here, as shown in FIG. 8, protruding pin 272 provided on component collection container 262 engages with engaging block 274 provided on the inside of side frame section 190. By this, component collection container 262 is rotated, and the bottom surface of component collection container 262 becomes vertical. Therefore, all the leaded components 410 inside component collection container 262 are returned inside component storage apparatus 100.

(c) Exchange of Leaded Components

Figure 14:
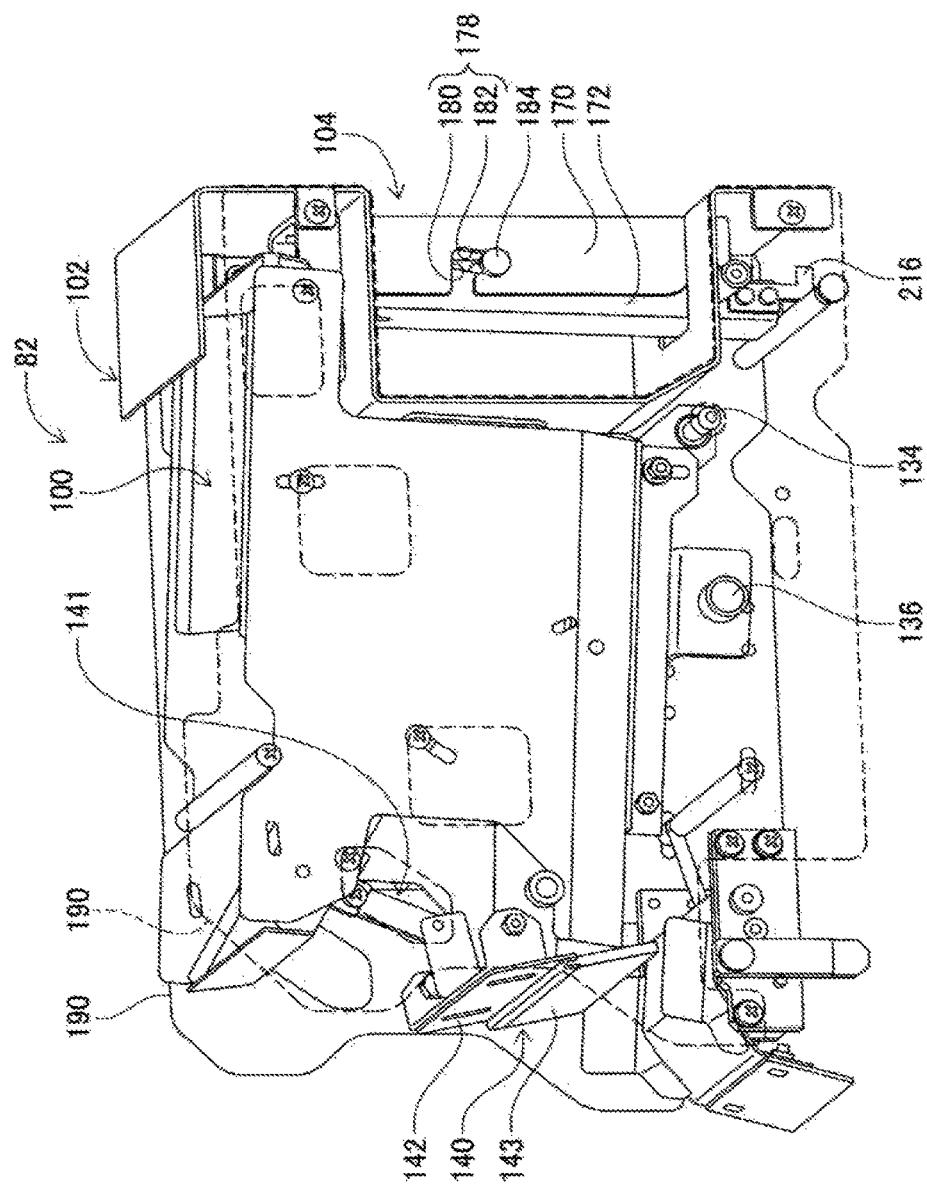
FIG. 14 is a perspective view of a component supply apparatus. Description of Preferred Embodiments The following describes in detail referring to the figures an example embodiment of the present disclosure.

Further, when the circuit board 12 being produced is changed, it is necessary to exchange leaded parts 410 to be supplied. In such a case, component supply apparatus 82 is removed from frame 96, and a component supply apparatus 82 corresponding to a new type of leaded component 410 is attached to frame 96. In detail, after leaded components 410 on component support member 220 have been returned inside component storage apparatus 100, an operator grasps grip 104 of component storage apparatus 82 and, as shown in FIG. 14, swings movable holding member 172 towards fixed holding member 170. Here, engaging member 184 of movable holding member 172 is inserted inside first cutout section 180 of fixed holding member 170. Further, when engaging member 184 reaches the top end of second cutout section 182, by the weight of component supply apparatus 82, engaging member 184 drops to the lower end of second cutout section 182. By this, the engagement of claw section 216 attached to the lower end of movable holding member 172 with the engaging rod is released, and it becomes possible to remove component supply apparatus 82 from frame 96, that is from between the pair of side frame sections 190.

Also, when grip 104 is held and movable holding member 172 is moved towards fixed holding member 170, component storage apparatus 100 is swung up inside housing 102 around support shaft 134. Here, in a similar manner to when roller 136 provided on the lower end section of component storage apparatus 100 rides on second edge section 234 on the upper edge of side wall section 228, link mechanism 141 operates and the end section on the brush 143 side of shutter 140 moves downwards. In this manner, with loose component supply device 32, with the releasing of the engagement of claw member 216 with the engaging rod, that is, with the releasing of the locking of component supply apparatus 82 to frame 96, the end section on the brush 143 of shutter 140 moves downwards such that the entrance of component storage apparatus through which components are ejected is covered by shutter 140. By this, it is possible to prevent the ejection of leaded components from component storage apparatus 100 when component storage apparatus 82 is removed from frame 96.

Also, because engaging member 184 of movable holding member 172 falls to the lower end of second cutout section 182 of fixed holding member 170, after an operator has removed component supply apparatus 82 from frame 96, even if the operator releases their hand from grip 104, movable holding member 172 is not swung by the elastic force of the spring, and the position of component storage apparatus 100 is maintained. Thus, even if an operator releases their hand from grip 104 after having removed component supply apparatus 82 from frame 96, the end section on the brush 143 side of shutter 140 moves downwards, such that the ejection of leaded components 410 from inside component storage apparatus 100 is prevented.

And, when component supply apparatus 82 is removed from frame 96, a component supply apparatus 82 corresponding to a new type of leaded component 410 is inserted between the pair of side frame sections 190. Here, cutout section 196 formed in the lower end section of side wall 120 of component supply apparatus 82 engages with engaging pin 192 of side frame section 190, and engaging pin 206 provided on the front end section of side wall 120 engages with inclined surface 202 of support member 200 of side frame section 190. By this, component supply apparatus 82 is positioned between the pair of side frame sections 190. And, by an operator moving engaging member 184 of grip 104 from the lower end to the upper end of second cutout section 182, movable holding member 172 is swung in a direction away from fixed holding member 170 by the elastic force of a spring. Here, claw section 216 attached to the bottom end section of movable holding member 172 engages with the engaging rod. By this, component supply apparatus 82 is locked to frame 96.

Also, when movable holding member 172 is moved in a direction away from fixed holding member 170, component storage apparatus 100 is moved down inside housing 102 around support shaft 134. Here, as shown in FIG. 7, storage apparatus side bracket 145 fixed to component storage apparatus 100 also moves down, and connecting link 147 connected to storage apparatus side bracket 145 moves down as well. Further, support member side bracket 146 connected to connecting link 147 also moves down, and the end section of the brush 143 side of shutter 140 swings upwards. By this, as shown in FIG. 4, the front of inclined surface 116 of component storage apparatus 100 is opened, and leaded components 410 are able to be ejected from component storage apparatus 100. In this manner, with loose component supply device 32, by exchanging component supply apparatus 82, it is possible to easily exchange the leaded components 410 to be supplied.

Note that, when component supply apparatus 82 is exchanged, ID information from RFID 217 of the component supply apparatus 82 newly attached to frame 96 is sent, and receiver 218 provided on frame main body section 210 of frame 96 receives the ID information. Then, based on the ID information, leaded components 410 supplied by the component apparatus 82 newly attached to frame 96 are verified.

Note that, in the above embodiments, loose component supply device 32 is an example of a component supply device. Component supply apparatus 82 is an example of a storage section. Frame 96 is an example of an attachment section. Component storage apparatus 100 is an example of a storage box. Housing 102 is an example of a housing. Shutter 140 is an example of a closing member. Link mechanism 141 is an example of a moving mechanism. Claw member 216 is an example of a locking mechanism. Component support member 220 is an example of a component support member.

Further, the present disclosure is not limited to the above example embodiments, and various changed or improved methods of embodiment are possible based on the knowledge of someone skilled in the art. Specifically, for example, in the above embodiment, shutter 140 is provided on side wall 120 of component storage apparatus 100 in a rotatable manner, but shutter 140 may be fixed to side wall 120. In this case, shutter 140 may cover the entrance of component storage apparatus 100 by the lower end of shutter 140 and inclined surface 116 of component storage apparatus 100 contacting when component storage apparatus 100 is swung up. Conversely, the entrance of component storage apparatus may be opened by the lower end of shutter 140 and inclined surface 116 of component storage apparatus 100 separating when component storage apparatus 100 is swung down.

REFERENCE SIGNS LIST

32: loose component supply device (component supply device); 82: component supply apparatus (storage section); 96: frame (attachment section); 100: component storage apparatus (storage box); 102: housing; 140: shutter (closing member); 141: link mechanism (moving mechanism); 216: claw member (locking mechanism); 220: component support member (component support section)

The invention claimed is:

1. A component supply device comprising:
   a storage section configured to store multiple components;
   an attachment section to which the storage section is removable;
   a locking mechanism configured to lock the storage section to the attachment section;
   a component support section configured to support multiple components, which have been discharged from an opening of the storage section that is attached to the attachment section, in a scattered state;
   a closing member that moves to and from an open position in which the opening of the storage section is open such that a component can be discharged from the opening, and a closed position in which at least a portion of the opening of the storage section is covered such that falling of components from the entrance is prevented; and
   a moving mechanism configured to move the closing member to the closed position in accordance with releasing of the locking of the storage section to the attachment section by the locking mechanism.

2. The component supply device according to claim 1, wherein
   the closing member is a brush member.

3. The component supply device according to claim 1, wherein
   the storage section includes a storage box configured to store multiple components and a housing configured to hold the storage box in a swingable manner,
   the locking mechanism releases the locking of the storage section to the attachment section by the storage box being swung in a specified direction, and
   the moving mechanism moves the closing member to the closed position by the storage box being swung in the specified direction.

4. The component supply device according to claim 1, wherein
   the moving mechanism includes a first bracket attached to the storage section, a second bracket attached to the closing member, and a third bracket connecting the first bracket to the second bracket, and
   movement of the storage section moves the closing member to the closed position via the first, second, and third brackets.

* * * * *